United States Patent
Hool

(10) Patent No.: US 7,115,988 B1
(45) Date of Patent: Oct. 3, 2006

(54) BYPASS CAPACITOR EMBEDDED FLIP CHIP PACKAGE LID AND STIFFENER

(75) Inventor: Vincent Hool, Fremont, CA (US)

(73) Assignee: Altera Corporation, San Jose, CA (US)

( * ) Notice: Subject to any disclaimer, the term of this patent is extended or adjusted under 35 U.S.C. 154(b) by 143 days.

(21) Appl. No.: 10/762,943

(22) Filed: Jan. 21, 2004

(51) Int. Cl.
*H01L 23/58* (2006.01)
*H01L 23/02* (2006.01)
*H01L 23/64* (2006.01)
*H01L 23/367* (2006.01)
*H01L 23/34* (2006.01)

(52) U.S. Cl. .............. 257/713; 257/E33.075; 257/E31.131; 257/E23.051; 257/E23.08; 257/E23.104; 257/E23.181; 257/712; 257/675; 257/717; 257/720; 257/710; 257/706; 257/704; 257/528; 257/523; 257/728; 257/719; 361/514; 361/697; 361/709; 361/704; 361/710; 361/707; 361/761; 361/719

(58) Field of Classification Search ........... 257/676, 257/675, 712, 713, 717, 719, 720, 710, 704, 257/706, 528, 523, 728, E23.104, E23.181, 257/E33.075, E31.131, E23.051, E23.08
See application file for complete search history.

(56) References Cited

U.S. PATENT DOCUMENTS 5,475,565 A * 12/1995 Bhattacharyya et al. .... 361/719
5,956,226 A * 9/1999 Jung et al. .................. 361/514
6,212,070 B1 * 4/2001 Atwood et al. ............. 361/704
6,225,696 B1 * 5/2001 Hathaway et al. .......... 257/728
6,888,235 B1 * 5/2005 Lopata et al. ............... 257/691

FOREIGN PATENT DOCUMENTS

JP            55-91152    *  7/1980  ................. 257/700

* cited by examiner

*Primary Examiner*—Alexander Oscar Williams
(74) *Attorney, Agent, or Firm*—Beyer Weaver & Thomas, LLP

(57) ABSTRACT

The present invention provides a heat spreader with a bypass capacitor to provide substantially instant power and/or to control simultaneous switching noise (SSN). The present invention also provides a semiconductor device package incorporating this heat spreader. In addition, fabrication methods for such heat spreaders and packages are provided. Generally, the heat spreaders and packages of the present invention include an embedded bypass capacitor that can provide decoupling capacitance in order to deliver near instant power to the die and/or minimize SSN. In a preferred embodiment, the embedded bypass capacitor is connected to terminals integrated with the heat spreader (e.g., lid; stiffener) and/or to a package plane (e.g., power plane or ground plane) in the package substrate for connection via the flip chip package's power delivery system to a power source and/or component.

16 Claims, 5 Drawing Sheets

BYPASS CAPACITOR EMBEDDED FLIP CHIP PACKAGE LID AND STIFFENER

BACKGROUND OF THE INVENTION

1. Field of the Invention

This invention relates generally to semiconductor device packages, and in particular to flip chip packages. More specifically, the invention relates to heat spreaders embedded with a bypass capacitor and their corresponding methods of fabrication.

2. Description of the Prior Art

In a semiconductor device package, a semiconductor chip (also referred to as an integrated circuit (IC) chip or "die") may be bonded directly to a package substrate. Such a die is formed with ball-shaped beads or bumps of solder affixed to its I/O bonding pads. During packaging, the die is "flipped" onto its front surface (e.g., active surface) so that the bumps form electrical connections between the die and conductive metal pads on a package substrate. A semiconductor device package of this type is commonly called a "flip chip package". As used herein, a flip chip package may include the packaging, the die, and/or their corresponding components.

A flip chip package is generally coupled to a printed circuit board (PCB) and powered by a system power supply located thereon. The system power supply is often connected to a system ground (ideally at 0V). The system power supply is also connected through power and ground leads to the flip chip package's power and ground planes for operating the flip chip package. Since the system power supply is often located a substantial distance away from the flip chip package, a long time delay and large inductance associated with the power and ground leads are introduced into the flip chip package's power delivery system. The flip chip package's power delivery system includes among other things all the connections between the flip chip package components (e.g., drivers) and their power sources (e.g., system power supply). As a result, the flip chip package components as well as the flip chip package as a whole operate in a suboptimal manner.

During its operation, a flip chip package may experience some degree of simultaneous switching noise (SSN). This may occur when multiple drivers switch simultaneously causing a voltage ripple in the flip chip package's power delivery system and offsetting the voltage reference within the flip chip package from its specified value. This voltage reference shift is commonly known as SSN and is exacerbated by the increased number of multiple drivers switching simultaneously in today's flip chip packages and the large inductance introduced by the earlier mentioned power and ground leads. As a result, SSN may cause errors in the operation of the die (e.g., drivers not responding correctly). Therefore, the more SSN present, the less reliable the flip chip package will become.

Accordingly, there is a need to provide improved flip chip packages and corresponding packaging methods that can provide substantially instant power and/or control the amount of SSN, thereby, improving package performance.

SUMMARY OF THE INVENTION

To achieve the foregoing, the present invention provides a heat spreader with an embedded bypass capacitor to provide substantially instant power and/or to control simultaneous switching noise (SSN). The present invention also provides a semiconductor device package incorporating this heat spreader. In addition, fabrication methods for such heat spreaders and packages are provided. Generally, the heat spreaders and packages of the present invention include an embedded bypass capacitor that can provide decoupling capacitance in order to deliver near instant power to the die and/or minimize SSN.

In one aspect, a heat spreader with a top surface and a bottom surface includes a bypass capacitor embedded within the heat spreader. The bypass capacitor includes a first plate, a second plate, a dielectric between the first and second plates, a first terminal coupled to the first plate, and a second terminal coupled to the second plate. The first terminal and the first plate are electrically insulated from the second terminal and the second plate.

In one embodiment, the bypass capacitor is embedded within a lid of the heat spreader. The bypass capacitor can be embedded within the lid either where the first and second plates are in a comb-type construction or where the first and second plates are in a wrapped-type construction. Typically, the first terminal and the second terminal are located on the bottom surface of the heat spreader. The lid may include a top cover connected to the first terminal and a bottom cover connected to the second terminal where the top cover is insulated from the bottom cover. The lid can even be a channel type lid. Alternatively, the bypass capacitor is embedded within a stiffener of the heat spreader.

In another embodiment, a second bypass capacitor is embedded within the heat spreader. The second bypass capacitor includes a third plate, a fourth plate, a second dielectric between the third and fourth plates, a third terminal coupled to the third plate, and a fourth terminal coupled to the fourth plate. The third terminal and the third plate are electrically insulated from the fourth terminal and the fourth plate. In this embodiment, the second bypass capacitor can be embedded within a stiffener of the heat spreader. The second bypass capacitor can further be embedded within the stiffener either where the third and fourth plates are in a comb-type construction or where the third and fourth plates are in a wrapped-type construction.

In another aspect, a semiconductor device package includes a die having front and back surfaces, a package substrate having die and board surfaces, a thermal adhesive material coupling a heat spreader in accordance with the present invention to the back surface of the die, and an adhesive coupling the heat spreader to the die surface of the package substrate.

In one embodiment, the bypass capacitor is embedded within a lid of the heat spreader. The bypass capacitor can be embedded within the lid either where the first and second plates are in a comb-type construction or where the first and second plates are in a wrapped-type construction. Typically, the first terminal and the second terminal are located on the bottom surface of the heat spreader. The lid may include a top cover connected to the first terminal and a bottom cover connected to the second terminal where the top cover is insulated from the bottom cover. The lid can even be a channel type lid. Alternatively, the bypass capacitor is embedded within a stiffener of the heat spreader.

In another embodiment, a second bypass capacitor is embedded within the heat spreader. The second bypass capacitor includes a third plate, a fourth plate, a second dielectric between the third and fourth plates, a third terminal coupled to the third plate, and a fourth terminal coupled to the fourth plate. The third terminal and the third plate are electrically insulated from the fourth terminal and the fourth plate. In this embodiment, the second bypass capacitor can be embedded within a stiffener of the heat spreader. The second bypass capacitor can further be embedded within the stiffener where either the third and fourth plates are in a comb-type construction or where the third and fourth plates are in a wrapped-type construction.

In yet another aspect, a method of fabricating a heat spreader includes: 1) providing a capacitor, the capacitor having a first plate, a second plate, and a dielectric between the first and second plates; and 2) encapsulating the capacitor inside a thermally conductive housing, thereby fabricating the heat spreader. The method can further include coupling a first terminal to the first plate and coupling a second terminal to the second plate.

Again in another aspect, a method of reducing simultaneous switching noise in a semiconductor device package having a die, package substrate, and a heat spreader, includes: 1) embedding a bypass capacitor within the heat spreader, the bypass capacitor having a first plate, a second plate, a dielectric between the first and second plates, a first terminal coupled to the first plate, and a second terminal coupled to the second plate; and 2) connecting the first and second terminals respectively to a first plane and a second plane, whereby the bypass capacitor reduces simultaneous switching noise when discharged by the die.

Finally, in another aspect, a semiconductor device package includes a die having front and back surfaces; a package substrate having die and board surfaces; a heat spreader having means for reducing simultaneous switching noise in the semiconductor device package; a thermal adhesive material coupling the heat spreader to the back surface of the die; and an adhesive coupling the heat spreader to the die surface of the package substrate.

These and other features and advantages of the invention will be presented in more detail below with reference to the associated drawings.

DETAILED DESCRIPTION OF SPECIFIC EMBODIMENTS

Figure 1A:
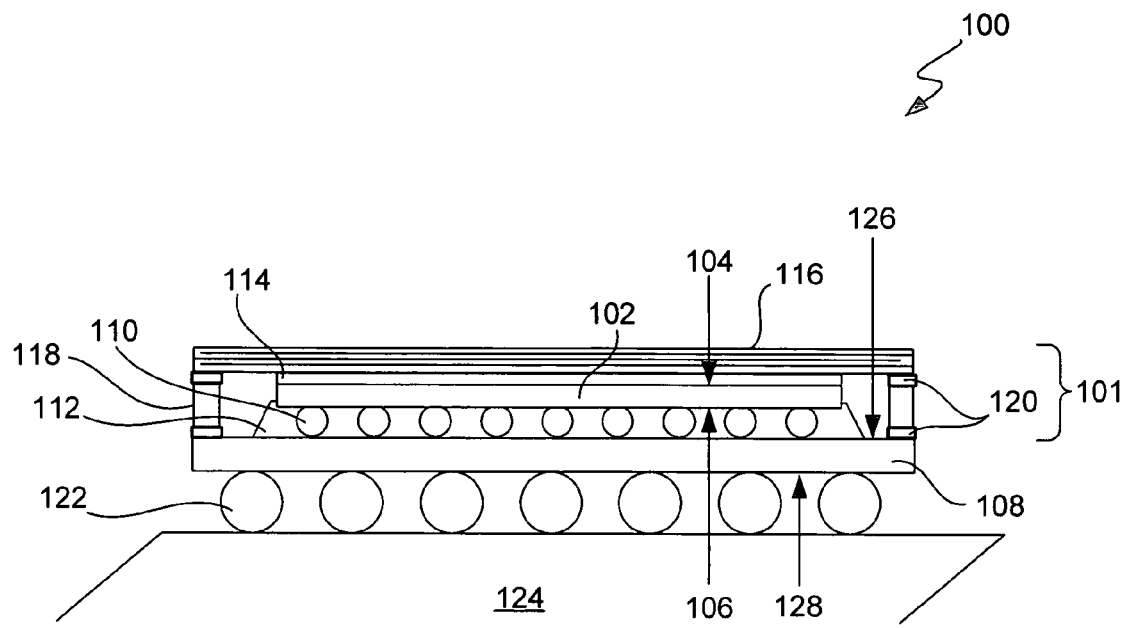
FIG. 1A illustrates a cross-sectional view of a semiconductor device package according to a first embodiment of the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a heat spreader with a bypass capacitor to provide substantially instant power and/or to control simultaneous switching noise (SSN). The present invention also provides a semiconductor device package incorporating this heat spreader. In addition, fabrication methods for such heat spreaders and packages are provided. Generally, the heat spreaders and packages of the present invention include an embedded bypass capacitor that can provide decoupling capacitance in order to deliver near instant power to the die and/or minimize SSN. Furthermore, a reduction in flip chip package plane impedance and resonance can result.

In order for a flip chip package as well as for any other semiconductor device package to operate, a power source having power (or positive) and ground (or negative) connections is generally required. Often the power source is required to operate the drivers within the die. However, depending on the location of the power source, a different amount of time delay and SSN will occur between the drivers and the power source.

One example of a power source is a bypass capacitor. A bypass capacitor typically stores energy when charged and can be recharged as needed. It may be used in combination with another power source (e.g., system power supply; another bypass capacitor). When integrated in a flip chip package's power delivery system, the bypass capacitor (depending on its location) can provide near instant power to the die and its components (e.g., drivers) while introducing relatively low impedance in the flip chip package's power delivery system (e.g., flip chip package's power or ground connections). In other words, a bypass capacitor can effectively be a source of near instant power while minimizing SSN if located close (e.g., within the flip chip package) to the die. For instance, by having a shorter electrical connection between the driver and its power source, a smaller amount of resistance and inductance is introduced in the power to ground loop or between the driver and its power source. As a result, a smaller voltage drop (hence, lower SSN) and a shorter time delay can occur.

A variety of strategies are used in providing near instant power and/or minimizing SSN. For example, FIG. 1A illustrates a cross-sectional view of a semiconductor device package according to a first embodiment of the present invention. As shown, flip chip package 100 includes a die 102 having a front surface 106 (i.e., active surface) and a back surface 104 (i.e., inactive surface). Die 102 may have any suitable set of dimensions. In one example, die 102 may have dimensions on the order of about 100–1089 mm$^2$ and 12–32 mils thick.

Once die 102 is chosen, die 102 is attached to a corresponding flip chip package substrate 108. Package substrate 108 may also have any suitable set of dimensions. For example, package substrate 108 may have dimensions on the order of about 400–2025 mm$^2$ (e.g., 23×23 mm, 45×45 mm). In attaching die 102 to package substrate 108, die 102 is positioned over package substrate 108 and bonded electrically and mechanically together in a solder joining operation. As shown, flip chip package substrate 108 has a die surface 126 and a board surface 128. It is important to note that the un-bonded die has an array of bumps 110 arranged on its front surface 106. Bumps 110 can be composed of any conductive material. High lead (95Pb5Sn) and eutectic (63Sn37Pb) solder are most common bump materials. However, Au and Cu can also be used.

Prior to bonding die 102 to substrate 108, flux is applied to either the front surface 106 of the die or the die surface 126 of package substrate 108. The flux serves primarily to allow solder to wet the joining surfaces, such that the bumps 110 make good contact with pre-solder covered electrical pads (not shown) on the package substrate. It may be applied in any of a variety of methods, including brushing or spraying, or dipping the die into a thin film, thereby coating the bumps with flux. The flux generally has an acidic component, which removes oxide barriers from the solder surfaces so that a better electrical connection can be established thereon. Non-cleaning or high temperature cleaning fluxes, as are known in the art, may be used.

After the flux is applied, die 102 is aligned with and placed onto a placement site on the package substrate 108 such that the die's bumps 110 are aligned and in contact with the pre-solder covered electrical pads (not shown) on substrate 108. The pre-solder covered electrical pads are electrically connected to the electrical traces (not shown) within the substrate. Substrate 108 is typically composed of an organic material, such as PTFE (such as TEFLON®, available form Gore, Eau Claire, Wis.), bismaleimide triazine (BT) resin, and other epoxy. However, substrate 108 may also be composed of ceramic or ceramic-plastic materials. Any conventional method for fabricating substrate 108 may be used. For example, laminate and substantial build-up fabrication methods can be used. Heat, typically above 200° C. (e.g., 240° C.), is applied to one or more of the die and the package substrate, causing bumps 110 to alloy and form electrical connections between die 102 and package substrate 108. The package is then cooled to harden the connection. Then, where necessary, the remaining flux residue is substantially removed in a cleaning step, for instance by washing with an appropriate solvent.

An underfill can be optionally applied in order to enhance the mechanical bonding of the die and package substrate. In one embodiment, an underfill material 112, typically a thermo-set epoxy, such as is available from Hysol Corporation of Industry, Calif. (e.g., product numbers 4549, 8439), Ablestik Laboratories of Rancho Domingo, Calif., or Namics, Reno, Nev. (e.g., product no. 8439-1) is dispensed into the remaining space (or "gap") between die 102 and substrate 108. In a typical procedure, a bead of thermo-set epoxy is applied along one edge of the die where it is drawn under the die by capillary action until it completely fills the gap between the die and the package substrate. Slight heating of the package substrate during dispensing of the underfill epoxy may assist the flow. In some cases, the underfill epoxy flow is further assisted by vacuum, or, alternatively, by injection of the epoxy into the gap. It should be noted that there may be other methods for applying underfill and that any underfill application may be used in conjunction with the present invention. Underfill 112 is then cured by heating the package substrate and die to an appropriate curing temperature for the underfill material, generally about 150° C., and curing for a specific amount of time at the temperature. In this manner the process produces an electrically and mechanically bonded semiconductor device package.

Flip chip package 100 also includes a heat spreader 101 composed of a thermally conductive material. Heat spreader 101 may either be in a one-piece heat spreader construction or in a two-piece heat spreader construction (e.g., lid 116 and conductive post 118; lid 216 and stiffener 218). That is, a heat spreader may be composed of a lid connected to the substrate via a stiffener or conductive post or may also have a form that allows for direct attachment to the substrate, such as through edges or legs that descend from the flat piece overlying the die to contact the package substrate. In either case, it is referred to herein as a heat spreader. In general, heat spreaders are made of metal. As shown in FIG. 1A, heat spreader 101 is connected to the back surface (e.g., inactive surface) of die 102 with a thermal adhesive material 114. The connection of the heat spreader to the substrate (and optionally the stiffener or conductive post) is made with an adhesive 120. Adhesive 120 may be either conductive or non-conductive depending on the application. For example, if adhesive 120 is to facilitate the connection of a circuit, such as connecting the bypass capacitor in the heat spreader with the package power or ground planes in the package substrate, a conductive adhesive can be appropriately applied (e.g., to the terminals as mentioned later).

In accordance with the present invention, a conventional flip chip package construction is replaced by the application of a heat spreader with an embedded bypass capacitor that can provide decoupling capacitance in order to deliver near instant power to the die and/or minimize SSN. This bypass capacitor embedded heat spreader may be constructed in a variety of ways. As such, flip chip package 100 may be more robust and/or reliably used when connected to a printed circuit board (PCB) 124 via a ball grid array (BGA) 122.

Figure 1B:
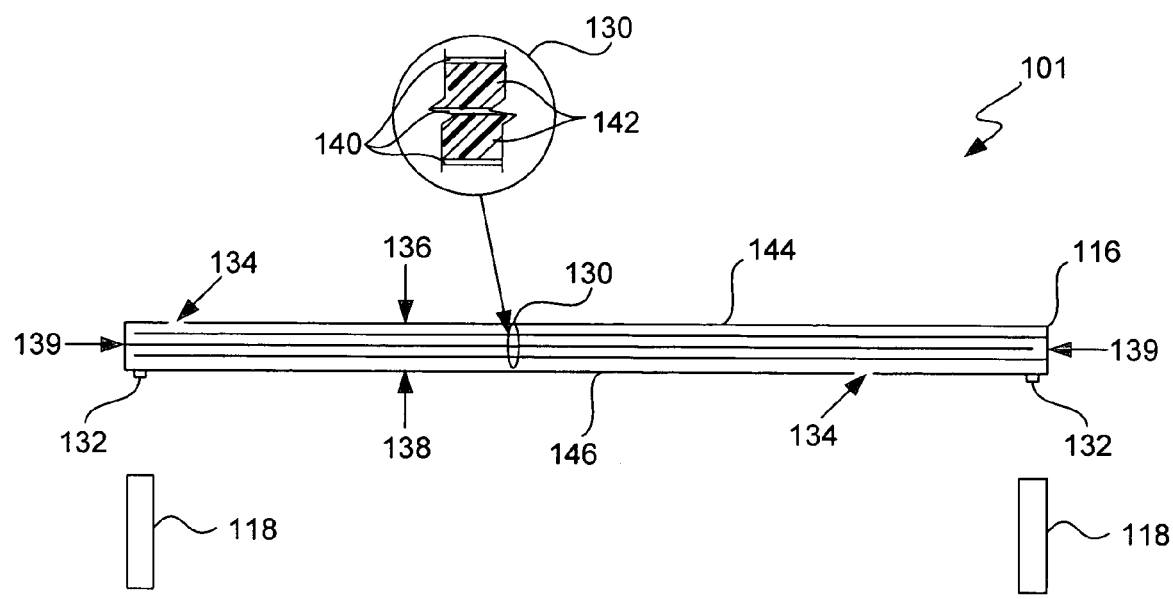
FIG. 1B illustrates a cross-sectional view of a heat spreader embedded with a bypass capacitor according to a first embodiment of the present invention.

To elaborate on bypass capacitor embedded heat spreader 101, reference will now be made to FIG. 1B. Bypass capacitor embedded heat spreader 101 (e.g., lid 116) often has a top surface 136, a bottom surface 138, and a plurality of side surfaces 139 that surrounds a bypass capacitor 130. Bypass capacitor 130 is typically constructed with plates 140 separated by a dielectric material 142. Generally, plate 140 may be connected to a power source for charging and/or an end vice (e.g., die, drivers, etc.) for powering. In a preferred embodiment, plate 140 is connected to a terminal 132 integrated with heat spreader 101 (e.g., lid 116) and/or to a package plane (e.g., power or ground) in the package substrate 108 for connection via the flip chip package's power delivery system to a power source and/or component. Terminal 132 may be made of any conductive material (e.g., gold). Terminal 132 may also have any shape or dimension as long as a solid electrical connection can be established with it. Terminal 132 may also be flat and coplanar with or protruding from the surface from which it is on.

It is important to note that multiple parallel or serial connections there-between (plate 140 to power source and/or component) may be necessary depending on the number and location of power sources and/or components that are to be connected. A variety of approaches may be taken in facilitating these connections. In one example, conductive post 118 is used for connecting a ground terminal 132 to a package ground plane. In another example, plate 140 is connected to terminal 132 by using either top cover 144 or bottom cover 146 as an intermediate connection. However, insulation 134 (e.g., air gap, insulation material, etc.) may be required between top cover 144 and bottom cover 146 if each is to assume a different voltage potential and to avoid electrical shorting.

In general, every pair of plates 140 (e.g., plates sharing a common dielectric in between) has a different voltage potential applied to each plate 140; thereby, allowing bypass capacitor 130 the ability to store power by charging itself or distribute power by discharging itself. Typically, the different voltage potentials are provided by AC voltage. Plates 140 and dielectric material 142 may be made of any material and formed into any size suitable for the application. For example, depending on the application needs, the amount of capacitance (typically on the order of Micro-Farads) can be selected by using different materials and having different square areas for the plates and dielectric. Typically, plate 140 is made from a conductive material. Preferably, the conductive material has high electrical conductivity characteristics. Examples of conductive materials include Cu, Al, Pt, Au, etc. On the other hand, dielectric material 142 includes a material with a dielectric constant in the range between 10 and 1000. Dielectric material 142 may include $SiO_2$, $Si_3N_4$, $Nb_2O_5$, $Al_2O_3$, $TiO_2$, etc.

Bypass capacitor 130 may be constructed in a variety of ways. Bypass capacitor 130 includes a pair of plates 140 separated by a dielectric material 142. Capacitor "plates" may have a variety of forms, including flat, folded, or wrapped sheets, or more complex shapes. In one specific embodiment, plates are arranged in a comb-type construction. That is, plates 140 include fingers that extend from a common side surface 139 to form a comb. Two comb-type plates are intermeshed with each other as illustrated in FIG. 1B. Also note that for simplicity of FIG. 1B, the illustrated stack shows only a few fingers of plates 140 separated by dielectric material to collectively form bypass capacitor 130. A bypass capacitor embedded heat spreader implemented in accordance with this embodiment of the invention may have any number of fingers on a capacitor plate. It is important to note that any conventional material, method, and technique may be used to fabricate any part of the bypass capacitor embedded heat spreader 101.

Figure 2A:
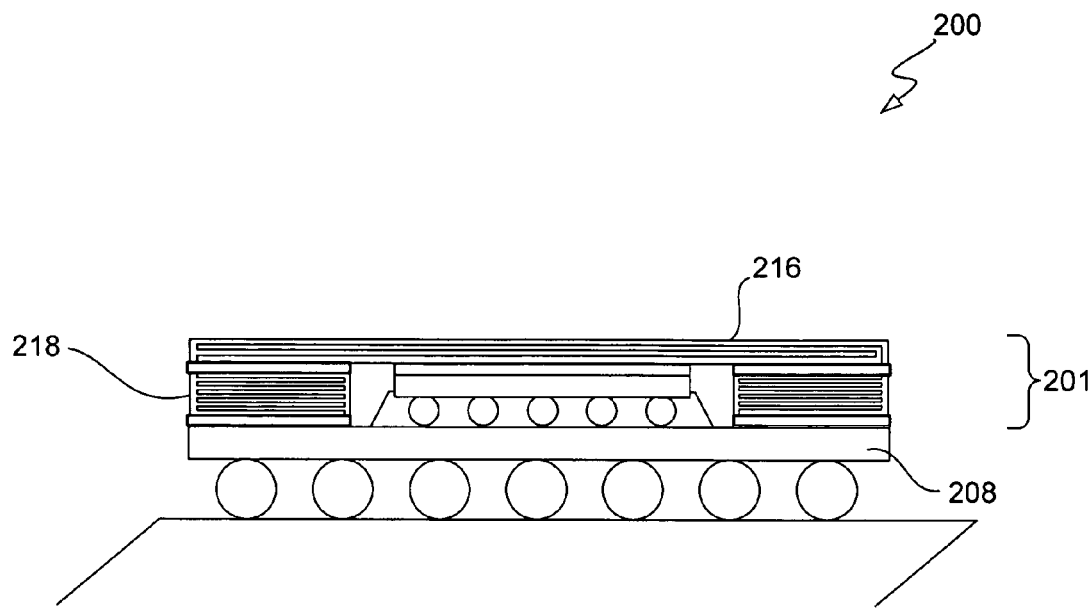
FIG. 2A illustrates a cross-sectional view of a semiconductor device package according to a second embodiment of the present invention.

Next, FIG. 2A illustrates a cross-sectional view of a semiconductor device package according to a second embodiment of the present invention. Many of the flip chip package processes and flip chip package elements used in flip chip package 100 may be used in flip chip package 200. As shown, a bypass capacitor embedded heat spreader 201 is used to form flip chip package 200.

To elaborate on bypass capacitor embedded heat spreader 201, reference will now be made to FIG. 2B. Bypass capacitor embedded heat spreader 201 (e.g., lid 216; stiffener 218) has a top surface 236, a bottom surface 238, and a plurality of side surfaces 239 that surrounds a bypass capacitor 230. The stiffener (also sometimes referred to as a "picture frame" or "window frame" due to the stiffener's appearance) is typically a flat piece of metal about 10 to 40 mils thick, having substantially the same dimensions as the package substrate with a window opening in its center to clear the die. One of the purposes of a stiffener is to provide stability to the substrate. The window opening may have a width that ranges from ⅓ to ⅔ of the overall width of the stiffener. As such, the stiffener may include an embedded bypass capacitor 230.

Bypass capacitor 230 is typically constructed with plates 240 separated by a dielectric material 242. Generally, plate 240 may be connected to a power source for charging and/or a component (e.g., die, drivers, etc.) for powering. In a preferred embodiment, plate 240 is connected to a terminal 232 integrated with heat spreader 201 (e.g., lid 216; stiffener 218) and/or to a package plane (e.g., power or ground) in the package substrate 208 for connection via the flip chip package's power delivery system to a power source and/or component. Terminal 232 may be made of any conductive material (e.g., gold). Terminal 232 may also have any shape or dimension as long as a solid electrical connection can be established with it. Terminal 232 may also be flat and coplanar with or protruding from the surface from which it is on.

It is important to note that multiple parallel or serial connections there-between (plate 240 to power source and/or component) may be necessary depending on the number and location of power sources and/or components that are to be connected. A variety of approaches may be taken in facilitating these connections. In one example, stiffener 218 is used for connecting a ground terminal 232 of lid 216 to a package ground plane in package substrate 208. As such, stiffener 218 may include bypass capacitor 230, a straight through electrical connection, and/or terminal 236 for completing these connections. It is important to note that depending on the size of stiffener 218, bypass capacitor 230 may or may not be embedded therein.

In general, every pair of plates 240 (e.g., plates sharing a common dielectric in between) has a different voltage potential applied to each plate 240; thereby, allowing bypass capacitor 230 the ability to store power by charging itself or distribute power by discharging itself. Typically, the different voltage potentials are provided by AC voltage. Plates 240 and dielectric material 242 may be made of any material and formed into any size suitable for the application. For example, depending on the application needs, the amount of capacitance (typically on the order of Micro-Farads) can be selected by using different materials and having different square areas for the plates and dielectric. Typically, plate 240 is made from a conductive material. Preferably, the conductive material has high electrical conductivity characteristics. Examples of conductive materials include Cu, Al, Pt, Au, etc. On the other hand, dielectric material 242 includes a material with a dielectric constant in the range between 10 and 1000. Dielectric material 242 may include $SiO_2$, $Si_3N_4$, $Nb_2O_5$, $Al_2O_3$, $TiO_2$, etc.

Figure 2B:
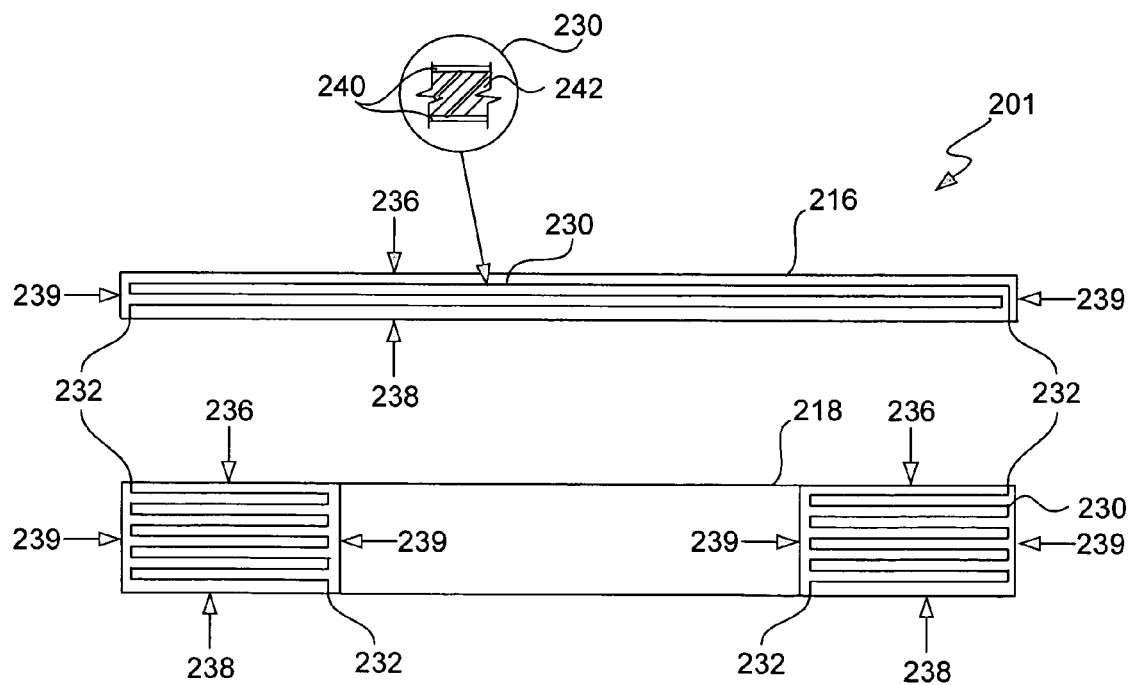
FIG. 2B illustrates a cross-sectional view of a heat spreader embedded with a bypass capacitor according to a second embodiment of the present invention.

Bypass capacitor 230 may also come in any number of different types, such as a prefabricated discrete capsule device or sheet as shown in FIG. 2B. In addition, bypass capacitor 230 may be arranged in any manner within heat spreader 201 (e.g., lid 216; stiffener 218), including the omission of bypass capacitor 230 in certain parts of the heat spreader as appropriate (e.g., taking into account cost, engineering feasibility, engineering practicality, etc.). In one embodiment, bypass capacitor 230 is aligned next to another bypass capacitor 230. In a preferred embodiment, bypass capacitor 230 is stacked. The stacking can be done in a variety of ways. For example, as shown, the stacking can be in a wrapped-type construction. That is, the bypass capacitor sheet (and therefore the plates therein) is wrapped to form multiple layers within heat spreader 201. It is important to note that any conventional material, method, and technique may be used to fabricate any part of the embedded bypass capacitor heat spreader 201.

Figure 3A:
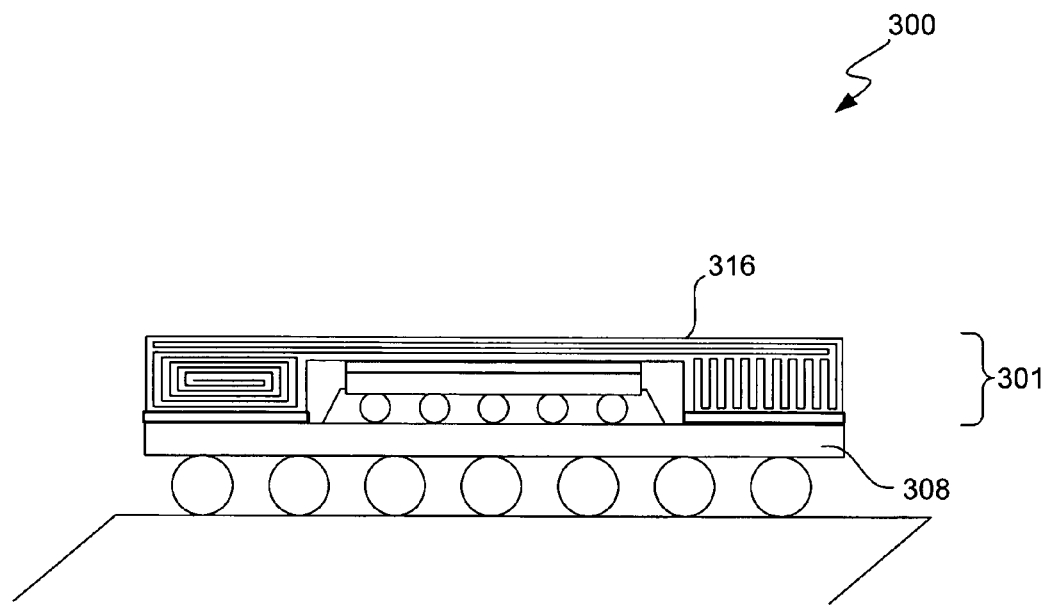
FIG. 3A illustrates a cross-sectional view of a semiconductor device package according to a third embodiment of the present invention.

Next, FIG. 3A illustrates a cross-sectional view of a semiconductor device package according to a third embodiment of the present invention. Many of the flip chip package processes and flip chip package elements used in flip chip package 100 may be used in flip chip package 300. As shown, a bypass capacitor embedded heat spreader 301 is used to form flip chip package 300. Bypass capacitor embedded heat spreader 301 is a one-piece heat spreader construction with leg openings at two opposite ends. The openings allow for heat spreader 301 to accommodate a die that extends beyond the open ends and, typically, beyond the corresponding edges of package substrate 308. This type of heat spreader is commonly known as a channel type lid.

To elaborate on bypass capacitor embedded heat spreader 301, reference will now be made to FIG. 3B. Bypass capacitor embedded heat spreader 301 (e.g., lid 316) has a top surface 336, a plurality of bottom surfaces 338, and a plurality of side surfaces 339 that surrounds a bypass capacitor 330. Bypass capacitor 330 is typically constructed with plates 340 separated by a dielectric material 342. Generally, plate 340 may be connected to a power source for charging and/or a component (e.g., die, drivers, etc.) for powering. In a preferred embodiment, plate 340 is connected to a terminal 332 integrated with heat spreader 301 (e.g., lid 316) and/or to a package plane (e.g., power or ground) in the package substrate 308 for connection via the flip chip package's power delivery system to a power source and/or component. Terminal 332 may be made of any conductive material (e.g., gold). Terminal 332 may also have any shape or dimension as long as a solid electrical connection can be established with it. Terminal 332 may also be flat and coplanar with or protruding from the surface from which it is on.

It is important to note that multiple parallel or serial connections there-between (plate 340 to power source and/or component) may be necessary depending on the number and location of power sources and/or components that are to be connected. A variety of approaches may be taken in facilitating these connections. For example, metal pads on the package substrate may be used to connect terminal 332 to the package plane. Another example is the use of insulated/isolated vias in connecting plate 340 to the package plane within the package substrate.

In general, every pair of plates 340 (e.g., plates sharing a common dielectric in between) has a different voltage potential applied to each plate 340; thereby, allowing bypass capacitor 330 the ability to store power by charging itself or distribute power by discharging itself. Typically, the different voltage potentials are provided by AC voltage. Plates 340 and dielectric material 342 may be made of any material and formed into any size suitable for the application. For example, depending on the application needs, the amount of capacitance (typically on the order of Micro-Farads) can be selected by using different materials and having different square areas for the plates and dielectric. Typically, plate 340 is made from a conductive material. Preferably, the conductive material has high electrical conductivity characteristics. Examples of conductive materials include Cu, Al, Pt, Au, etc. On the other hand, dielectric material 342 includes a material with a dielectric constant in the range between 10 and 1000. Dielectric material 342 may include $SiO_2$, $Si_3N_4$, $Nb_2O_5$, $Al_2O_3$, $TiO_2$, etc.

Figure 3B:
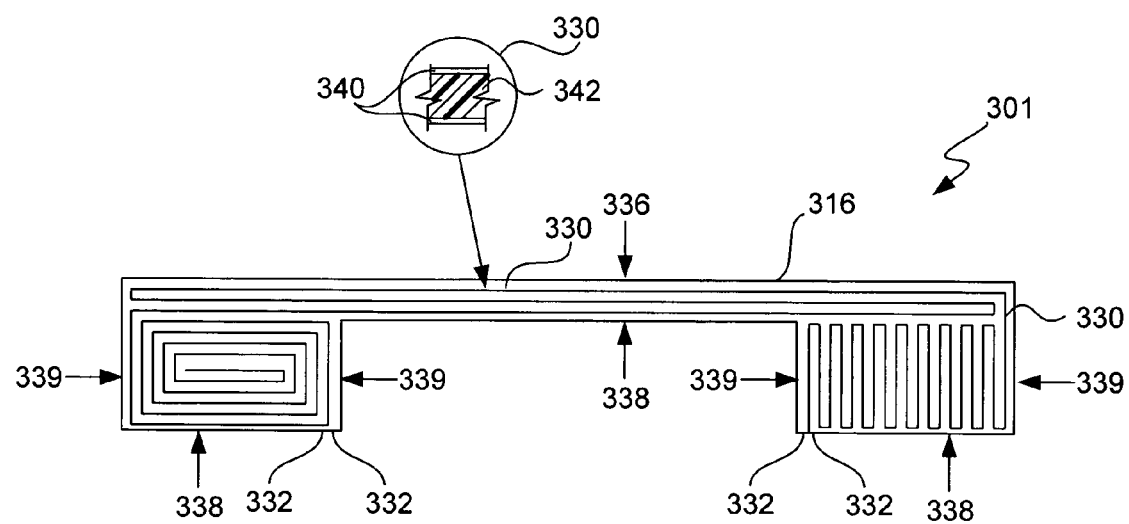
FIG. 3B illustrates a cross-sectional view of a heat spreader embedded with a bypass capacitor according to a third embodiment of the present invention.

Bypass capacitor 330 may also come in any number of different types, such as a prefabricated discrete capsule device or a sheet as shown in FIG. 3B. In addition, bypass capacitor 330 may be arranged in any manner within heat spreader 301 (e.g., lid 316), including the omission of bypass capacitor 330 in certain parts of the heat spreader as appropriate (e.g., taking into account cost, engineering feasibility, engineering practicality, etc.). In one embodiment, bypass capacitor 330 is aligned next to another bypass capacitor 330. In a preferred embodiment, bypass capacitor 330 is stacked. The stacking can be done in a variety of ways. For example, as shown, the stacking can be in a wrapped-type construction. That is, the bypass capacitor sheet (and therefore the plates therein) is wrapped to form multiple layers within heat spreader 301. It is important to note that any conventional material, method, and technique may be used to fabricate any part of the embedded bypass capacitor heat spreader 301.

Figure 4A:
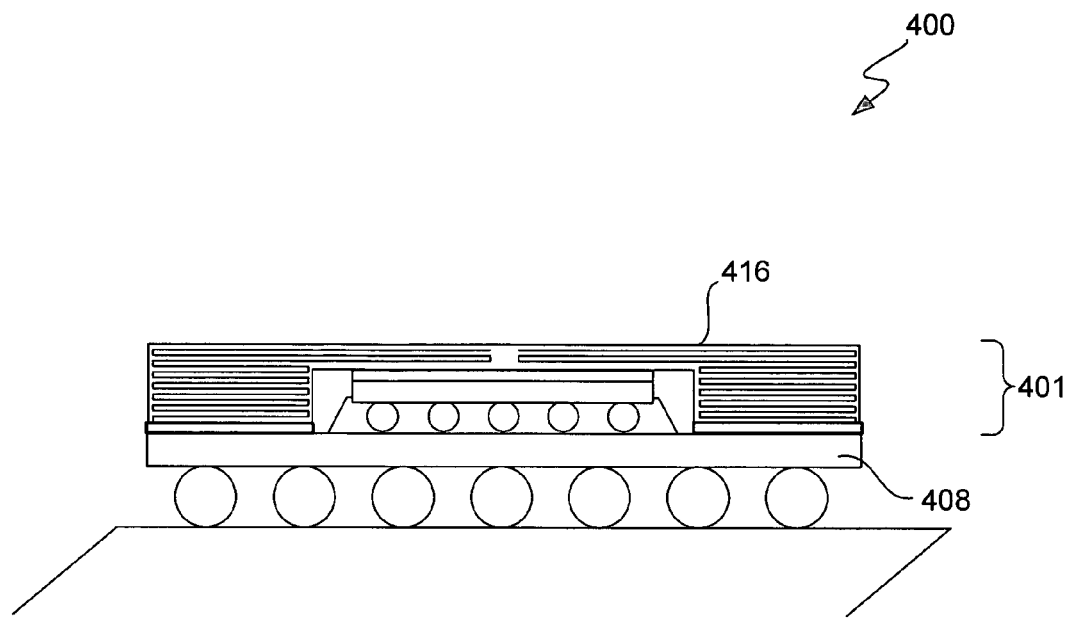
FIG. 4A illustrates a cross-sectional view of a semiconductor device package according to a fourth embodiment of the present invention.

Next, FIG. 4A illustrates a cross-sectional view of a semiconductor device package according to a fourth embodiment of the present invention. Many of the flip chip package processes and flip chip package elements used in flip chip package 100 may again be used in flip chip package 400. As shown, a bypass capacitor embedded heat spreader 401 is used to form flip chip package 400. Bypass capacitor embedded heat spreader 401 is another one-piece heat spreader construction but with no leg openings. That is, legs descend from the flat piece overlying the die such that the legs form a continuous wall (e.g., ring) around the die.

To elaborate on bypass capacitor embedded heat spreader 401, reference will be made to FIG. 4B. Bypass capacitor embedded heat spreader 401 (e.g., lid 416) has a top surface 436, a plurality of bottom surfaces 438, and a plurality of side surfaces 439 that surrounds a plurality of bypass capacitors 430. Bypass capacitor 430 is typically constructed with plates 440 separated by a dielectric material 442. Generally, plate 440 may be connected to a power source for charging and/or a component (e.g., die, drivers, etc.) for powering. In a preferred embodiment, plate 440 is connected to a terminal 432 integrated with heat spreader 401 (e.g., lid 416) and/or to a package plane (e.g., power or ground) in the package substrate 408 for connection via the flip chip package's power delivery system to a power source and/or component. Terminal 432 may be made of any conductive material (e.g., gold). Terminal 432 may also have any shape or dimension as long as a solid electrical connection can be established with it. Terminal 432 may also be flat and coplanar with or protruding from the surface from which it is on.

It is important to note that multiple parallel or serial connections there-between (plate 440 to power source and/or component) may be necessary depending on the number and location of power sources and/or components that are to be connected. A variety of approaches may be taken in facilitating these connections. For example, multiple terminals 432 may be implemented to correspond with an individual bypass capacitor. Alternatively, several bypass capacitors may share a common terminal 432 (e.g., ground terminal).

In general, every pair of plates 440 (e.g., plates sharing a common dielectric in between) has a different voltage potential applied to each plate 440; thereby, allowing bypass capacitor 430 the ability to store power by charging itself or distribute power by discharging itself. Typically, the different voltage potentials are provided by AC voltage. Plates 440 and dielectric material 442 may be made of any material and formed into any size suitable for the application. For example, depending on the application needs, the amount of capacitance (typically on the order of Micro-Farads) can be selected by using different materials and having different square areas for the plates and dielectric. Typically, plate 440 is made from a conductive material. Preferably, the conductive material has high electrical conductivity characteristics. Examples of conductive materials include Cu, Al, Pt, Au, etc. On the other hand, dielectric material 442 includes a material with a dielectric constant in the range between 10 and 1000. Dielectric material 442 may include $SiO_2$, $Si_3N_4$, $Nb_2O_5$, $Al_2O_3$, $TiO_2$, etc.

Figure 4B:
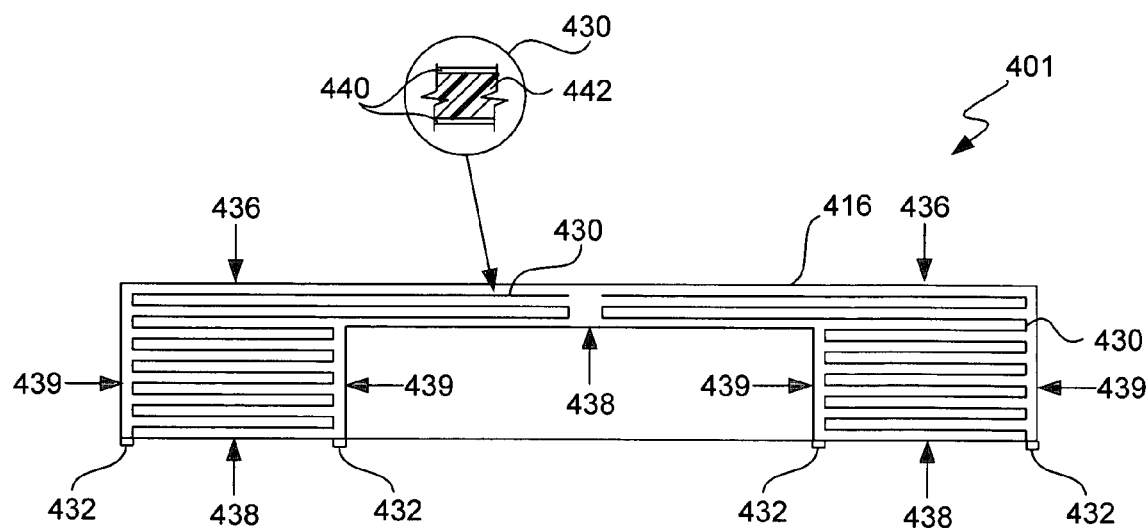
FIG. 4B illustrates a cross-sectional view of a heat spreader embedded with a bypass capacitor according to a fourth embodiment of the present invention.

Bypass capacitor 430 may also come in any number of different types, such as a prefabricated discrete capsule device or a sheet as shown in FIG. 4B. In addition, bypass capacitor 430 may be arranged in any manner within heat spreader 401 (e.g., lid 416), including the omission of bypass capacitor 430 in certain parts of the heat spreader as appropriate (e.g., taking into account cost, engineering feasibility, engineering practicality, etc.). In one embodiment, bypass capacitor 430 is aligned next to another bypass capacitor 430. In a preferred embodiment, bypass capacitor 430 is stacked. The stacking can be done in a variety of ways. For example, as shown, the stacking can be in a wrapped-type construction. That is, the bypass capacitor sheet (and therefore the plates therein) is wrapped to form multiple layers within heat spreader 401. It is important to note that any conventional material, method, and technique may be used to fabricate any part of the embedded bypass capacitor heat spreader 401.

According to the present invention, the heat spreaders and packages include an embedded bypass capacitor that can provide decoupling capacitance in order to deliver near instant power to the die and/or minimize SSN. The near instant power is created by locating a power source (e.g., bypass capacitor) as close as possible to the die or its components (e.g., driver, etc.); thus, resulting in a minimal time delay created by the shorter distance between the power source and die/die components. Depending on the application, the bypass capacitor may be selectively charged or discharged. For instance, an algorithm may be used to determine the amount of charging or discharging necessary. On the other hand, the bypass capacitor may be hardwired to charge or discharge automatically via the flip chip package's power delivery system. SSN can also be minimized due to the shorter distance created between the power source and die/die components. In fact, whenever used by the die, bypass capacitor may reduce the amount of SSN that may otherwise take place. This is because of the lower inductance and resistance associated with having a shorter connection. That is, a low impedance of the flip chip package's power delivery system can be achieved. Furthermore, by having a larger capacitance as provided by the bypass capacitor, there will be more opportunities to use the bypass capacitor in place of the system power source. Therefore, by using the bypass capacitor of the present invention, the overall amount of SSN that the flip chip package may otherwise experience (e.g., not using the bypass capacitor) can be reduced and minimized.

One of the many advantages of having bypass capacitor embedded heat spreaders is to make available the possibility of providing larger amounts of capacitance (typically, in the range of a few to decades Micro-Farads depending on the application; e.g., 5 to 300 Micro-Farads) at a lower cost as compared to some other approaches. One approach involves attaching bypass capacitors around the flip chip package on the PCB. However, this approach produces a relatively high inductive electrical path between the power source (i.e., bypass capacitors) and the flip chip package. Another approach is to mount the bypass capacitors around the die, but instead on the package substrate. Unfortunately, the amount of capacitance available (typically in the range of 10 to 1000 Pico-Farads) is substantially limited by the space available on the package substrate (e.g., the area of the package substrate between the die and the heat spreader) to be effective. This is especially evident in cases where the die is large, such as in programmable logic devices. Yet another approach is to embed the bypass capacitor within the package substrate. Again, there is limited space (defined by micro via and PTH—plated through hole) available and increased difficulty in substrate fabrication that results in lower yields and higher costs. Finally, there is an approach to embed the bypass capacitor in the die itself (e.g., next to the i/o buffer). However, this approach would increase the silicon die size and again result in higher costs.

Although the heat spreader of the present invention includes embedded bypass capacitors, the heat spreader's common function of dissipating heat generated by the die can still be achieved. Depending on the construction of the bypass capacitor embedded heat spreaders, the effectiveness of heat dissipation can be controlled. For instance, by encapsulating/compacting the bypass capacitor within the heat spreader such that gaps are minimized therein can increase the amount of heat dissipation. Moreover, the types of material used to construct the bypass capacitor as well as the heat spreader can also contribute to the amount of heat dissipation realized.

Figure 5:
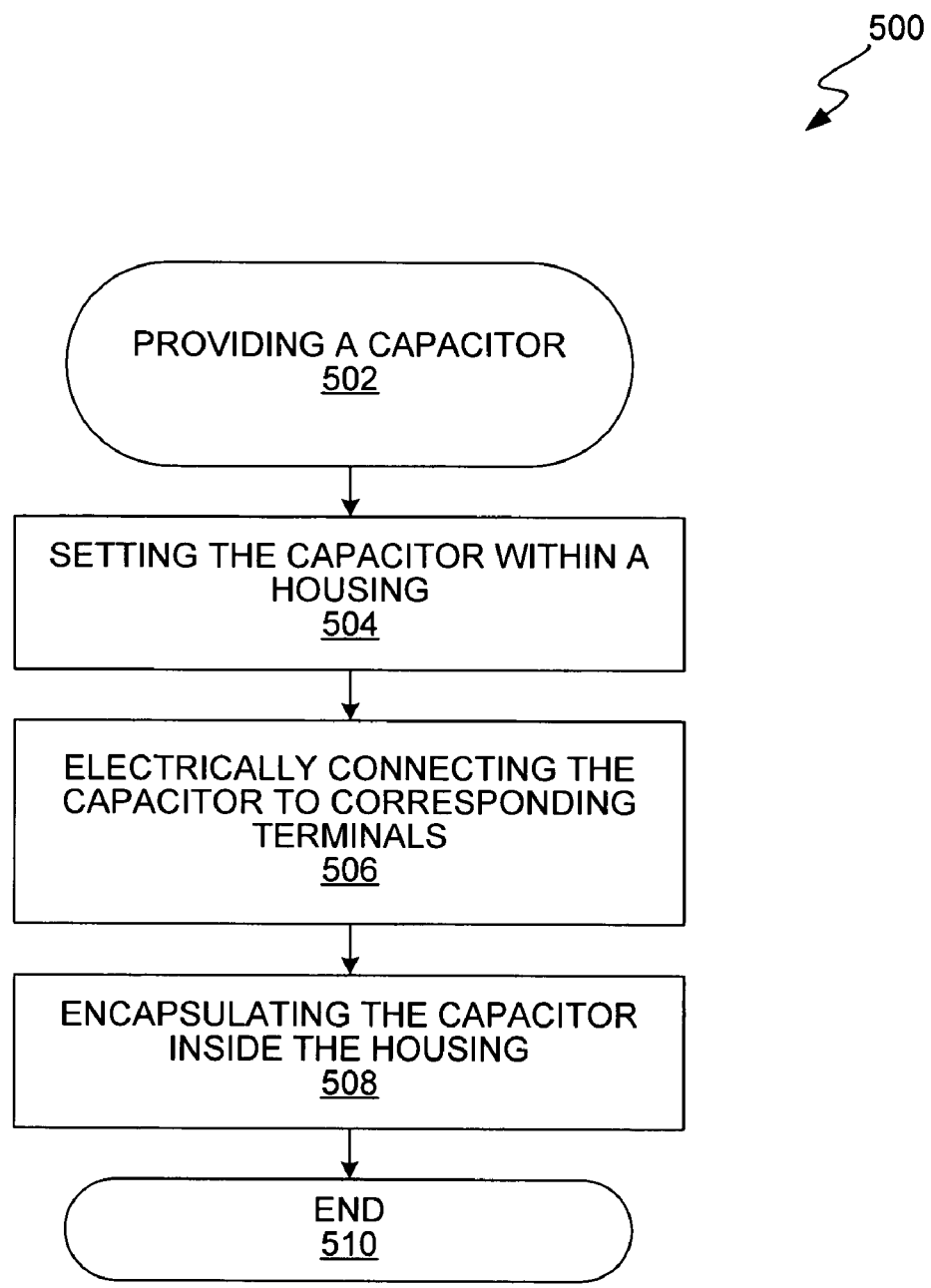
FIG. 5 illustrates a flow diagram of fabricating a heat spreader according to various embodiment of the present invention.

The heat spreaders described in the present invention may be constructed using any number of methods. For example, FIG. 5 illustrates a flow diagram 500 of fabricating a heat spreader according to various embodiments of the present invention. Beginning at operation 502, the step of providing a capacitor is performed. Any type of capacitor may be used. One example is a capacitor sheet. Next, setting the capacitor within a housing may be performed in operation 504. This may include arranging the capacitor in a manner suitable for the housing. For instance, a capacitor sheet may be arranged in a wrapped-type construction or a comb-type construction. The housing may be made of any material. In a preferred embodiment, the housing is made of a thermally conductive material. After the capacitor has been set in the housing, the step of electrically connecting the capacitor to corresponding terminals may be performed in operation 506. The terminals may be located anywhere on the housing. Next, the step of encapsulating the capacitor inside the housing may be performed in operation 508. The encapsulation may be made separately or in combination with the housing. Finally, flow diagram 500 ends at operation 510.

It will be appreciated by persons of ordinary skill in the art that some of the process operations may be substituted, rearranged, omitted, merged, or repeated. For example, repeating operation 504 in setting another capacitor within the housing. Hence, a multi-capacitor embedded heat spreader can be created. Multiple capacitors are advantageous in efficiently providing more capacitance. This is because of the possible shorter power to ground loops and more capacitor plate surface area available. Another example is the merging of operation 506 with operation 508. Instead of electrically connecting the capacitor to corresponding terminals on the housing in a separate operation, the capacitor may connect to corresponding terminals upon the encapsulation.

CONCLUSION

The foregoing invention presents many advantages over conventional heat spreaders and semiconductor device packages that incorporate them. For example, the present invention provides an improved flip chip package solution for providing substantially instant power and/or controlling the amount of SSN, thereby, improving the flip chip package's performance. In addition, the present invention can be implemented without substantially affecting the form factors of today's heat spreaders and flip chip packages. Moreover, the bypass capacitors are not implemented within more costly package components such as the die or the package substrate. As a result, the present invention can be implemented without impacting the die or package substrate manufacturing (MFG) yield.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A heat spreader having a top surface and a bottom surface, comprising:

a bypass capacitor embedded within the heat spreader, the bypass capacitor having a first plate, a second plate, a dielectric between the first and second plates, a first terminal coupled to the first plate, and a second terminal coupled to the second plate, wherein first terminal and the first plate are electrically insulated from the second terminal and the second plate, wherein the heat spreader is operable to transfer heat between the top and bottom surfaces of the heat spreader.

2. The heat spreader of claim 1, wherein the bypass capacitor is embedded within a lid of the heat spreader.

3. The heat spreader of claim 2, wherein the bypass capacitor is embedded within the lid where the first and second plates are in a comb-type construction.

4. The heat spreader of claim 2, wherein the bypass capacitor is embedded within the lid where the first and second plates are in a wrapped-type construction.

5. The heat spreader of claim 1, wherein the first terminal and the second terminal are located on the bottom surface of the heat spreader.

6. The heat spreader of claim 2, wherein the lid includes a top cover connected to the first terminal and a bottom cover connected to the second terminal, the top cover being insulated from the bottom cover.

7. The heat spreader of claim 2, wherein the lid is a channel type lid.

8. The heat spreader of claim 1, wherein the bypass capacitor is embedded within a stiffener of the heat spreader.

9. The heat spreader of claim 1, further comprising:

a second bypass capacitor embedded within the heat spreader, the second bypass capacitor having a third plate, a fourth plate, a second dielectric between the third and fourth plates, a third terminal coupled to the third plate, and a fourth terminal coupled to the fourth plate, wherein the third terminal and the third plate are electrically insulated from the fourth terminal and the fourth plate.

10. The heat spreader of claim 9, wherein the second bypass capacitor is embedded within a stiffener of the heat spreader.

11. The heat spreader of claim 10, wherein the second bypass capacitor is embedded within the stiffener where the third and fourth plates are in a comb-type construction.

12. The heat spreader of claim 10, wherein the second bypass capacitor is embedded within the stiffener where the third and fourth plates are in a wrapped-type construction.

13. The heat spreader of claim 1, wherein the first and second plates are made of a material selected from the group consisting of Cu, Al, Pt, and Au.

14. The heat spreader of claim 1, wherein the first and second dielectrics have a dielectric constant in the range of 10 and 1000.

15. The heat spreader of claim 1, wherein the top and bottom surfaces are completely made of metal.

16. The heat spreader of claim 1, wherein the bottom surface is operable to receive a corresponding surface of a die.

* * * * *